United States Patent
Wakazono

(10) Patent No.: US 11,211,784 B2
(45) Date of Patent: Dec. 28, 2021

(54) OUTPUT DEVICE AND POWER SOURCE SYSTEM

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Keisuke Wakazono, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/761,529

(22) PCT Filed: Oct. 30, 2018

(86) PCT No.: PCT/JP2018/040209
§ 371 (c)(1),
(2) Date: May 5, 2020

(87) PCT Pub. No.: WO2019/093187
PCT Pub. Date: May 16, 2019

(65) Prior Publication Data
US 2020/0266621 A1 Aug. 20, 2020

(30) Foreign Application Priority Data
Nov. 9, 2017 (JP) .............................. JP2017-216603

(51) Int. Cl.
*H02H 7/12* (2006.01)
*H02H 7/125* (2006.01)

(52) U.S. Cl.
CPC ......... *H02H 7/1213* (2013.01); *H02H 7/1257* (2013.01)

(58) Field of Classification Search
CPC .. H02H 7/1213; H02H 7/1257; H02H 11/002; H02J 1/00; B60R 16/02; B60R 16/03
(Continued)

(56) References Cited

U.S. PATENT DOCUMENTS 6,492,747 B1 * 12/2002 Hoffmann .............. H01H 9/106
307/131
7,982,339 B2 * 7/2011 Yeh .......................... H02J 9/061
307/66

(Continued)

FOREIGN PATENT DOCUMENTS

JP    H6-141465 A    5/1994
JP    H7-046756 A    2/1995
(Continued)

OTHER PUBLICATIONS

International Search Report, Application No. PCT/JP2018/040209, dated Jan. 22, 2019. ISA/Japan Patent Office.

*Primary Examiner* — Yemane Mehari
(74) *Attorney, Agent, or Firm* — Honigman LLP

(57) ABSTRACT

An output device outputs a DC voltage applied between a first terminal and a second terminal via the drain and the source of a semiconductor switch. The output device includes a conversion circuit configured to convert the DC voltage into a voltage of a predetermined polarity, irrespective of the polarity of the DC voltage. A booster circuit boosts the voltage that was converted by the conversion circuit and applies the boosted voltage to the gate of the semiconductor switch. The semiconductor switch is on if the voltage of the control terminal with respect to the potential of the first terminal is at least a predetermined voltage.

9 Claims, 1 Drawing Sheet

(58) Field of Classification Search
USPC .......................................................... 361/87
See application file for complete search history.

(56) References Cited

U.S. PATENT DOCUMENTS

| 8,450,881 | B2* | 5/2013 | Wortberg | ............... | H01H 9/106 |
| | | | | | 307/131 |
| 10,598,703 | B2* | 3/2020 | Douglass | ........... | G06K 7/10366 |
| 2011/0026285 | A1* | 2/2011 | Kawashima | ...... | H02M 3/33576 |
| | | | | | 363/127 |
| 2014/0247030 | A1* | 9/2014 | Sakai | ...................... | H02M 3/04 |
| | | | | | 323/283 |

FOREIGN PATENT DOCUMENTS

| JP | 2007-019812 A | 1/2007 |
| JP | 2014-003562 A | 1/2014 |

* cited by examiner

OUTPUT DEVICE AND POWER SOURCE SYSTEM

CROSS-REFERENCE TO RELATED APPLICATIONS

This application is the U.S. national stage of PCT/JP2018/040209 filed on Oct. 30, 2018, which claims priority of Japanese Patent Application No. JP 2017-216603 filed on Nov. 9, 2017, the contents of which are incorporated herein.

TECHNICAL FIELD

The present disclosure relates to an output device and power source system.

BACKGROUND

JP 2007-19812A discloses an automotive output device that includes a semiconductor switch through which the output device outputs DC voltage that has been applied by a battery to a first terminal and to a second terminal of the output device. The voltage that is output by the output device is applied to a load. The semiconductor switch in the output device described in JP 2007-19812A is an N-channel FET (Field Effect Transistor). The drain of the semiconductor switch is connected to a first terminal. The source of the semiconductor switch is connected to one end of a load. The other end of the load is connected to a second terminal. The source and the drain of the semiconductor switch are respectively connected to a cathode and an anode of a parasitic diode. A terminal switch is connected to the gate of the semiconductor switch and to the second terminal.

The semiconductor switch is on if the voltage at the gate with respect to the potential of the source is at least a predetermined voltage, and the semiconductor switch is off if the voltage at the gate with respect to the potential of the source is less than a predetermined voltage. The output device described in JP 2007-19812A further includes a driver circuit that switches the semiconductor switch and the terminal switch on or off, respectively. The driver circuit is connected to the gate of a semiconductor switch and switches the semiconductor switch on by raising the voltage at the gate, or switches the semiconductor switch off by lowering the voltage at the gate. The driver circuit switches the terminal switch off if the semiconductor switch switches on, and switches the terminal switch on if the semiconductor switch switches off.

In a state in which the semiconductor switch and the terminal switch are respectively off and on, a battery is connected to the first terminal and to the second terminal. If the cathode and the anode of the battery are respectively connected to the first terminal and the second terminal, the output of voltage can be properly performed and properly stopped by the driver circuit switching the semiconductor switch on or off.

If the cathode and the anode of the battery are incorrectly connected to the second terminal and the first terminal respectively, electrical current flows via the parasitic diode of the semiconductor switch when the semiconductor switch is kept off. If a large electrical current flows via the parasitic diode for a long period of time, the temperature of the semiconductor switch may rise to an abnormal temperature, and the semiconductor switch may become damaged.

With the output device described in JP 2007-19812A, if the cathode and the anode of the battery are incorrectly connected to the second terminal and the first terminal respectively, the voltage at the gate with respect to the potential of the source will substantially match the output voltage of the battery and rise to, or above, a predetermined voltage. As a result, the semiconductor switch is forcibly switched on and the electrical current flows through the semiconductor switch and not through the parasitic diode. For this reason, the period of time in which electrical current flows via the parasitic diode is also the period of time from when the battery is connected to when the semiconductor switch switches on, and thus is short and lowers the likelihood that the semiconductor switch will become damaged.

In the output device described in JP 2007-19812A, with the resistance value of the load as a reference, it is presumed that the resistance value between the first terminal and the drain of the semiconductor switch is sufficiently small.

If the cathode and the anode of the battery are incorrectly connected to the second terminal and the first terminal respectively, then the larger the resistance value between the first terminal and the drain of the semiconductor switch is, the higher the voltage with respect to the potential of the first terminal is at the source of the semiconductor switch. On the other hand, the voltage at the gate of the semiconductor switch with respect to the potential of the first terminal substantially matches the output voltage of the battery, irrespective of the resistance value between the first terminal and the drain of the semiconductor switch.

For this reason, if the resistance value between the first terminal and the drain of the semiconductor switch is large when the cathode and the anode of the battery are incorrectly connected to the second terminal and the first terminal respectively, the voltage at the gate with respect to the potential of the source might not rise to or above the predetermined voltage and the semiconductor switch might not be forcibly switched on. If the semiconductor switch is not forcibly switched on, a large electrical current may continue to flow through the parasitic diode of the semiconductor switch for a long period of time, and the semiconductor switch may become damaged.

Accordingly, an object of the present disclosure is to provide an output device and power source system with which it is possible to keep a semiconductor switch on if the polarity of DC voltage applied between two terminals is incorrect.

SUMMARY

An output device according to a mode of the present disclosure is configured to output a DC voltage, which is applied between two terminals, via a first terminal and a second terminal of a semiconductor switch, the output device comprising: a conversion circuit configured to convert the DC voltage into a voltage of a predetermined polarity, irrespective of the polarity of the DC voltage; and a booster circuit configured to boost the voltage converted by the conversion circuit and apply the boosted voltage to a control terminal of the semiconductor switch, wherein the semiconductor switch is on if the voltage at the control terminal with respect to the potential of the first terminal is at least a predetermined voltage.

A power source system according to another mode of the present disclosure includes the output device described above, and a load to which the DC voltage output by the output device is applied.

Effect of Present Disclosure

With the present disclosure, it is possible to reliably keep a semiconductor switch on if the polarity of DC voltage applied between two terminals is incorrect.

DETAILED DESCRIPTION OF PREFERRED EMBODIMENTS

Figure 1:
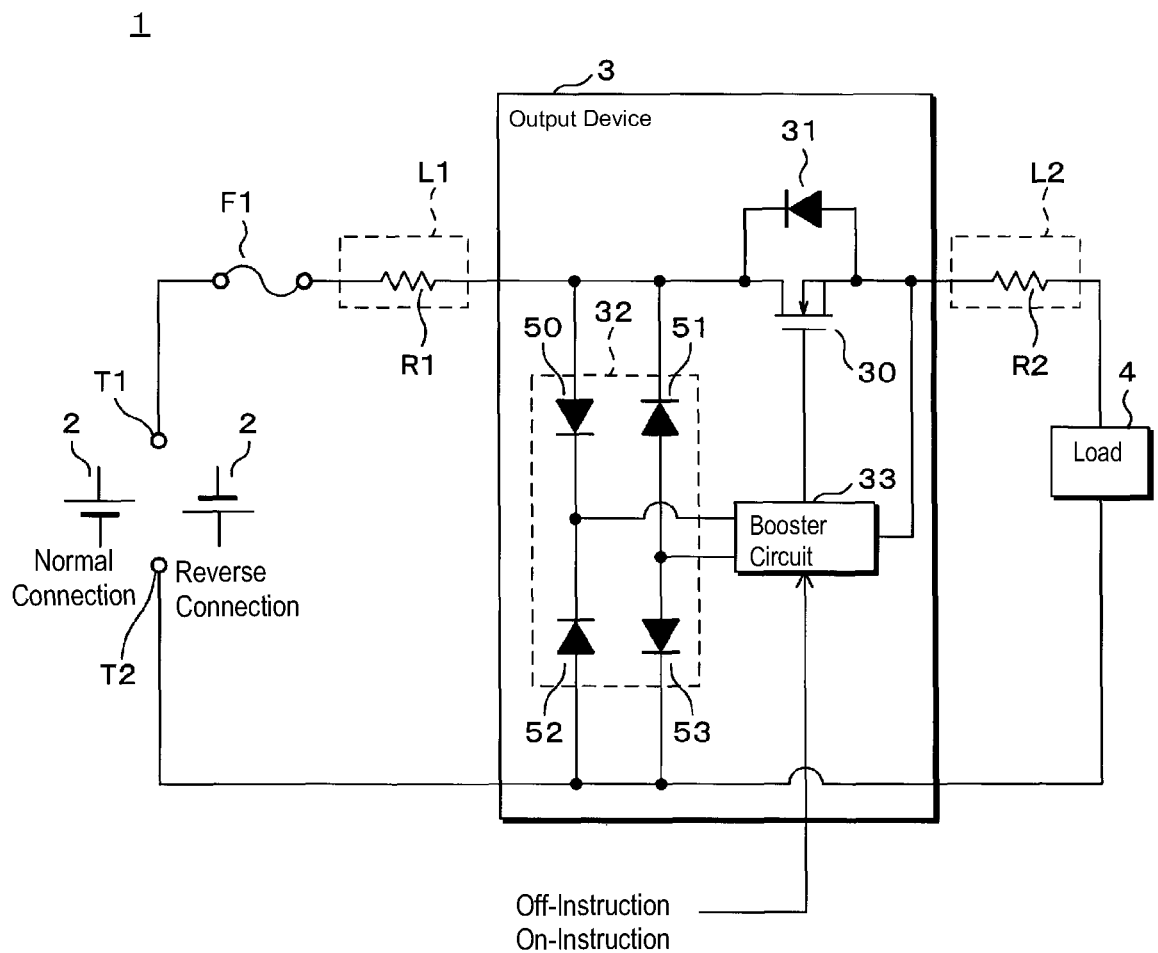
FIG. 1 is a circuit diagram of a power source system in the present embodiment.

First, embodiments of the present disclosure will be listed and described. At least parts of the embodiments described below may also be freely combined.

An output device according to a mode of the present disclosure is configured to output a DC voltage, which is applied between two terminals, via a first terminal and a second terminal of a semiconductor switch, the output device comprising: a conversion circuit configured to convert the DC voltage into a voltage of a predetermined polarity, irrespective of the polarity of the DC voltage; and a booster circuit configured to boost the voltage converted by the conversion circuit and apply the boosted voltage to a control terminal of the semiconductor switch, wherein the semiconductor switch is on if the voltage at the control terminal with respect to the potential of the first terminal is at least a predetermined voltage.

With this embodiment, if the polarity of DC voltage applied between two terminals is incorrect, the conversion circuit converts the DC voltage into a voltage with correct polarity for example, similar to when the polarity of the DC voltage is positive. The booster circuit boosts the voltage that was converted by the conversion circuit and applies the boosted voltage to the control terminal of the semiconductor switch. Assume that the width of the voltage raised by the booster circuit is sufficiently large. In this case, the voltage applied by the booster circuit is sufficiently high and the semiconductor switch is therefore reliably switched on, irrespective of the resistance value between another terminal and a second terminal of the semiconductor switch.

With the output device according to another mode of the present disclosure, the booster circuit is configured to start boosting if the DC voltage is applied between the two terminals.

With this embodiment, the booster circuit starts boosting voltage and the semiconductor switch switches on if DC voltage is applied between two terminals, irrespective of the polarity of the DC voltage.

A power source system according to another mode of the present disclosure including the output device described above, and a load to which the DC voltage output by the output device is applied.

With this embodiment, the output device outputs voltage to a load and the load operates.

The power source system according to another mode of the present disclosure further includes a fuse element that is configured to melt if a current flows therethrough that is at least a predetermined current, wherein the DC voltage is applied to the load via the semiconductor switch and the fuse element.

With this embodiment, the semiconductor switch switches on even if the polarity of the DC voltage is incorrect. In such a state, the fuse element melts to prevent over-current from flowing therethrough if the electrical current that flows via the semiconductor switch is large.

Specific examples of the power source system according to embodiments of the present disclosure will be described hereinafter with reference to the drawings. Note that the present disclosure is not limited to the illustrations, but rather is indicated by the claims. All modifications within the meaning and range of equivalence to the claims are intended to be encompassed therein.

FIG. 1 is a circuit diagram of a power source system 1 according to the present embodiment. The power source system 1 is suitably installed in a vehicle and includes a battery 2, an output device 3, a load 4, a fuse element F1, a first conductive wire L1, a second conductive wire L2, a first terminal T1, and a second terminal T2. The battery 2 is connected to the first terminal T1 and to the second terminal T2. The first conductive wire L1 and the second conductive wire L2 both have respective resistance components. The equivalent circuit of the first conductive wire L1 is shown as a first resistance R1, and the equivalent circuit of the second conductive wire L2 is shown as a second resistance R2.

The first terminal T1 is connected to one end of the fuse element F1. The other end of the fuse element F1 is connected to one end of the first conductive wire L1. The first conductive wire L1 and the second terminal T2 are connected to the output device 3. The output device 3 is furthermore connected to one end of the second conductive wire L2. The other end of the second conductive wire L2 is connected to one end of the load 4. The other end of the load 4 is connected to the output device 3.

If the battery 2 is connected to the first terminal T1 and to the second terminal T2, the battery 2 applies DC voltage between the first terminal T1 and the second terminal T2. The output device 3, via the second conductive wire L2, outputs the DC voltage applied to the first terminal T1 and the second terminal T2. The DC voltage output by the output device 3 is applied to the load 4.

The load 4 is an electrical apparatus that is installed in a vehicle. In the load 4, electrical current can flow not only from one end of the load 4 to the other end, but also from the other end to the one end.

If the cathode and the anode of the battery 2 are respectively connected to the first terminal T1 and the second terminal T2, the connection of the battery 2 is a normal connection and the polarity of the DC voltage with respect to the potential of the second terminal T2 is positive. If the connection of the battery 2 is a normal connection, electrical current flows from the first terminal T1 to the fuse element F1, the first conductive wire L1, the output device 3, the second conductive wire L2, the load 4, the output device 3, and the second terminal T2 in that order. Thus, power is supplied to the load 4 and the load 4 operates normally.

If the cathode and the anode of the battery 2 are respectively connected to the second terminal T2 and the first terminal T1, the connection of the battery 2 is a reverse connection, or in other words is an incorrect connection. At this time, the polarity of the DC voltage with respect to the potential of the second terminal T2 is negative. If the connection of the battery 2 is a reverse connection, electrical current flows from the second terminal T2 to the output device 3, the load 4, the second conductive wire L2, the output device 3, the first conductive wire L1, the fuse element F1, and the first terminal T1 in that order.

The fuse element F1 may be a fuse, a fusible link, or the like. The fuse element F1 melts if the electrical current that flows through the fuse element F1 is at least a predetermined electrical current. If the fuse element F1 melts, electrical current is cut off from the output device 3, the load 4, the first conductive wire L1, and the second conductive wire L2, thus preventing over-current from flowing therethrough.

The output device 3 includes the semiconductor switch 30, a diode 31, a conversion circuit 32, and a booster circuit 33. The semiconductor switch 30 is an N-channel FET. The diode 31 is a parasitic diode that is formed through the manufacturing process of the semiconductor switch 30. The cathode and the anode of the diode 31 are respectively connected to the drain and the source of the semiconductor switch 30. The conversion circuit 32 includes four diodes 50, 51, 52, and 53.

In the output device 3, the other end of the first conductive wire L1 is connected to the drain of the semiconductor switch 30, and the source of the semiconductor switch 30 is connected to one end of the second conductive wire L2. The drain of the semiconductor switch 30 is also connected to the anode of the diode 50 and to the cathode of the diode 51. The cathode of the diode 50 is connected to the cathode of the diode 52. The anode of the diode 51 is connected to the anode of the diode 53. The anode of the diode 52 and the cathode of the diode 53 are connected to the second terminal T2. A first connection node between the diodes 50 and 52, and a second connection node between the diodes 51 and 53 are individually connected to the booster circuit 33. The booster circuit 33 is also individually connected to the source and gate of the semiconductor switch 30. The other end of the load 4 is also connected to the second terminal T2.

The conversion circuit 32 is a passive element that converts the DC voltage applied between the first terminal T1 and the second terminal T2. The converted voltage that was converted by the conversion circuit 32 is output from the first connection node and the second connection node to the booster circuit 33.

If the connection of the battery 2 is a normal connection, electrical current flows from the first terminal T1 to the fuse element F1, the first conductive wire L1, the diode 50, the booster circuit 33, the diode 53, and the second terminal T2 in that order. At this time, the polarity of the converted voltage with respect to the potential of the second connection node is positive.

If the connection of the battery 2 is a reverse connection, electrical current flows from the second terminal T2 to the diode 52, the booster circuit 33, the diode 51, the first conductive wire L1, the fuse element F1, and the first terminal T1 in that order. At this time, the polarity of the converted voltage with respect to the potential of the second connection node is positive.

As described above, the conversion circuit 32 converts DC voltage to a voltage whose polarity is positive, irrespective of the polarity of the DC voltage with respect to the potential of the second terminal T2.

Note that the polarity of the converted voltage is always negative if referenced against the potential of the first connection node, irrespective of the polarity of the DC voltage. "Converted voltage" described below means a voltage with respect to the potential of the second connection node.

The booster circuit 33 boosts the converted voltage that is input from the conversion circuit 32. The booster circuit 33 applies the voltage that has been boosted (hereinafter referred to as "boosted voltage") to the gate of the semiconductor switch 30. The boosted voltage described in the present embodiment means a voltage with respect to the potential of the second connection node.

Electrical current can flow between the drain and the source of the semiconductor switch 30 if the voltage at the gate with respect to the potential of the source is at least a predetermined voltage. At this time, the semiconductor switch 30 is on. Also, electrical current does not flow between the drain and the source of the semiconductor switch 30 if the voltage at the gate with respect to the potential of the source is less than a predetermined voltage. At this time, the semiconductor switch 30 is off.

The source, the drain, and the gate of the semiconductor switch 30 are respectively equivalent to a first terminal, a second terminal, and a control terminal.

In the semiconductor switch 30, the booster circuit 33 monitors the voltage at the gate (hereinafter referred to as the "gate voltage") with respect to the potential of the source. The booster circuit 33 adjusts the boosted voltage by adjusting the width of boost of the converted voltage. Specifically, the booster circuit 33 adjusts the boosted voltage such that the gate voltage reaches a fixed set voltage that is set in advance. The set voltage is equal to or higher than a predetermined voltage. For this reason, the semiconductor switch 30 is on when the booster circuit 33 performs voltage boost.

If the booster circuit 33 stops boosting voltage, the boosted voltage is not applied to the gate of the semiconductor switch 30, and therefore the gate voltage is below a predetermined voltage and the semiconductor switch 30 is off.

As described above, electrical current flows to the first connection node, the booster circuit 33, and the second connection node in that order if the battery 2 is connected to the first terminal T1 and to the second terminal T2, irrespective of whether or not the connection of the battery 2 is a normal connection. At this time, converted voltage is output from the first connection node and the second connection node to the booster circuit 33, and power for performing voltage boost is supplied to the booster circuit 33.

The booster circuit 33 performs voltage boost by repeatedly switching a switch to alternate between on and off, the switch being connected to one end of an inductor. The power used to perform voltage boost may include, for example, power used for switching a switch in the booster circuit 33 on or off.

Figure 2:
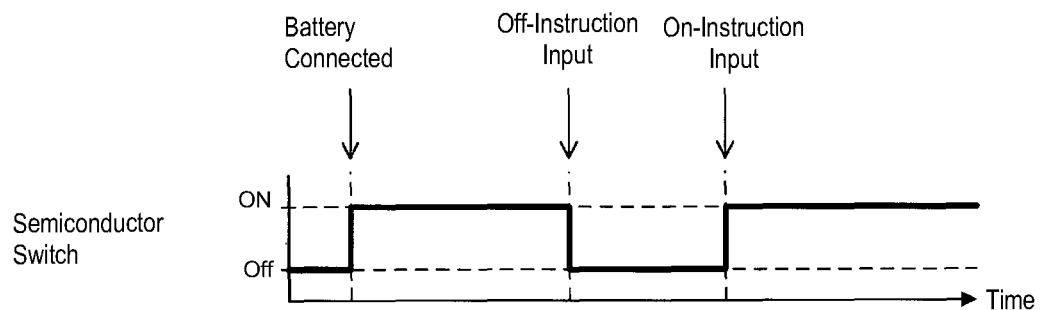
FIG. 2 is a timing chart illustrating the operations of an output device.

FIG. 2 is a timing chart illustrating the operations of the output device 3. FIG. 2 shows the semiconductor switch 30 transitioning between on and off. The horizontal axis of the transitioning shows the time thereof.

First, if the battery 2 is not connected to the first terminal T1 nor to the second terminal T2, that is to say that the first terminal T1 and the second terminal T2 are open, power is not supplied to the booster circuit 33. For this reason, the booster circuit 33 stops boosting voltage and the semiconductor switch 30 is off. If the semiconductor switch 30 is off, electrical current does not flow via the drain nor via the source of the semiconductor switch 30, and the output device 3 stops outputting voltage via the semiconductor switch 30. At this time, DC voltage is not applied to the load 4, and therefore the load 4 stops operating.

Irrespective of whether or not the connection of the battery 2 is a normal connection, that is to say irrespective of the polarity of the DC voltage with respect to the potential of the second terminal T2, power is supplied to the booster circuit 33 if the battery 2 is connected to the first terminal T1 and to the second terminal T2, and the booster circuit 33 thus starts boosting the converted voltage that has been converted by the conversion circuit 32. Thus, the semiconductor switch 30 switches on.

If the connection of the battery 2 is a normal connection and the semiconductor switch 30 is on, the electrical current flows from the first terminal T1 to the fuse element F1, the first conductive wire L1, the semiconductor switch 30, the second conductive wire L2, the load 4, and the second terminal T2 in that order. At this time, the output device 3 outputs the DC voltage applied between the first terminal T1 and the second terminal T2 via the drain and the source of the semiconductor switch 30, and thus the DC voltage that is output by the output device 3 is applied to the load 4. The DC voltage is applied to the load 4 via the semiconductor switch 30 and the fuse element F1. The load 4 operates if DC voltage is applied to the load 4.

If the connection of the battery 2 is a reverse connection and the semiconductor switch 30 is on, the electrical current flows from the the second terminal T2 to the load 4, the second conductive wire L2, the semiconductor switch 30, the first conductive wire L1, the fuse element F1, and the first terminal T1 in that order.

As described above, the fuse element F1 melts if the electrical current that flows through the fuse element F1 is at least a predetermined electrical current. Accordingly, the fuse element F1 melts if the sum of the electrical current that flows via the semiconductor switch 30 and the electrical current that flows through the booster circuit 33 is at least a predetermined electrical current. This configuration cuts off electrical current flowing via the semiconductor switch 30 and prevents over-current from flowing via the semiconductor switch 30.

As described above, electrical current flows via the semiconductor switch 30 and the fuse element F1 if the battery 2 is connected to the first terminal T1 and to the second terminal T2, irrespective of whether or not the connection of the battery 2 is a normal connection. Thus, the fuse element F1 acts to prevent over-current from flowing via the semiconductor switch 30.

If the connection of the battery 2 is a normal connection, the booster circuit 33 is input with an off-instruction that instructs the semiconductor switch 30 to switch off, and an on-instruction that instructs the semiconductor switch 30 to switch on.

The booster circuit 33 stops applying boosted voltage if the off-instruction is input thereto. As a result, the semiconductor switch 30 switches off. If the connection of the battery 2 is normal and the semiconductor switch 30 is off, the electrical current does not flow via the drain nor the source of the semiconductor switch 30. At this time, the output device 3 stops outputting voltage via the semiconductor switch 30. As a result, the application of DC voltage to the load 4 stops and the load 4 stops operating.

The booster circuit 33 starts applying boosted voltage again if an on-instruction is input thereto. As a result, the semiconductor switch 30 switches on and the load 4 starts operating again.

If the connection of the battery 2 is a reverse connection, neither the off-instruction nor the on-instruction are input to the booster circuit 33. Accordingly, if the battery 2 is connected to the first terminal T1 and to the second terminal T2 and the connection of the battery 2 is a reverse connection, the booster circuit 33 continues to apply boosted voltage and the semiconductor switch 30 remains on.

Note that the output device 3 may also output a notification signal showing that the connection of the battery 2 is a reverse connection if the polarity of the voltage at the first terminal T1 with respect to the potential of the second terminal T2 is negative.

With the output device 3 configured as described above, if the polarity of the DC voltage applied between the first terminal T1 and the second terminal T2 is incorrect, that is to say that the connection of the battery 2 is a reverse connection, the conversion circuit 32 converts the DC voltage into a voltage of a predetermined polarity, similar to when the polarity of the DC voltage is positive. The booster circuit 33 boosts the converted voltage and applies the boosted voltage to the gate of the semiconductor switch 30. The booster circuit 33 adjusts the boosted voltage such that the gate voltage reaches a set voltage, with the set voltage being at least a predetermined voltage for switching the semiconductor switch 30 on and off. For this reason, the semiconductor switch 30 is reliably switched on if the booster circuit 33 boosts the voltage of the semiconductor switch 30, irrespective of the resistance value of the first resistance R1.

Also, if the connection of the battery 2 is a reverse connection and the semiconductor switch 30 is off, electrical current flows through the diode 31, that is to say that electrical current flows through the parasitic diode of the semiconductor switch 30. However, if the connection of the battery 2 is a reverse connection, the semiconductor switch 30 switches on and therefore the period in which electrical current flows via the diode 31 is short. If the semiconductor switch 30 is on, the voltage between the cathode and the anode of the diode 51 is substantially 0 V and therefore electrical current does not flow through the diode 51.

Furthermore, if the connection of the battery 2 is a reverse connection and electrical current is flowing via the semiconductor switch 30, the fuse element F1 melts if the electrical current flowing via the semiconductor switch 30 is large. Thus, over-current is prevented from flowing via the semiconductor switch 30.

Note that, the power source connected to the first terminal T1 and to the second terminal T2 need not be a battery, and it is sufficient that said power source is a DC power source. Also, if it is possible to switch the semiconductor switch 30 on, for example if the width of the voltage boosted by the booster circuit 33 is sufficiently large, the booster circuit 33 need not adjust the boosted voltage such that gate voltage reaches a set voltage.

The embodiments disclosed herein are examples in all respects, and are not to be interpreted as restrictive. The scope of the present disclosure is defined not by the meanings of the foregoing descriptions but rather by the scope of the claims, and is intended to encompass all modifications within the meanings and scope that are equivalent to the claims.

The invention claimed is:

1. An output device configured to output a DC voltage, which is applied between two terminals of a battery, via a first terminal and a second terminal of a semiconductor switch, the output device comprising:
   a conversion circuit configured to convert the DC voltage from the battery into a voltage of a predetermined polarity, irrespective of a polarity of the DC voltage;
   a booster circuit configured to boost the voltage converted by the conversion circuit and apply the boosted voltage to a control terminal of the semiconductor switch and
   wherein the conversion circuit is interposed between the battery and the booster circuit, so as to be interposed between a first terminal of the battery and the booster circuit and a second terminal of the battery and the booster circuit,
   wherein the semiconductor switch is on if the voltage at the control terminal with respect to a potential of the first terminal is at least a predetermined voltage, so as to protect the semiconductor switch in the event of a reverse polarity connection.

2. The output device according to claim 1, wherein the booster circuit is configured to start boosting if the DC voltage is applied between the two terminals.

3. A power source system, comprising:
   the output device according to claim 1; and
   a load to which the DC voltage output by the output device is applied.

4. The power source system according to claim 3, further comprising:
   a fuse element that is configured to melt if a current flows there through that is at least a predetermined current,
   wherein the DC voltage is applied to the load via the semiconductor switch and the fuse element.

5. The power source system as set forth in claim 3, wherein the booster circuit is configured to start boosting if the DC voltage is applied between the two terminals.

6. The power source system according to claim 5, further comprising:
   a fuse element that is configured to melt if a current flows there through that is at least a predetermined current,
   wherein the DC voltage is applied to the load via the semiconductor switch and the fuse element.

7. The power source system according to claim 5, further comprising:
   a fuse element that is configured to melt if a current flows there through that is at least a predetermined current,
   wherein the DC voltage is applied to the load via the semiconductor switch and the fuse element and wherein the booster circuit is configured to start boosting if the DC voltage is applied between the two terminals.

8. The output device according to claim 1, wherein the conversion circuit includes a first diode, a second diode, a third diode and a fourth diode each having an anode and a cathode, wherein the anode of the first diode and the cathode of the second diode are connected to the second terminal of the semiconductor switch, and the anode of the third diode and the cathode of the fourth diode are connected to the first terminal of the semiconductor switch, and wherein the cathode of the first diode and the cathode of the third diode are connected to a first connection node interposed between the first diode and the third diode, and the anode of the second diode and the anode of the fourth diode are connected to a second connection node interposed between the second diode and the fourth diode, and a first conductive line connects the booster circuit to the first connection node and a second conductive line connects the booster circuit to the second connection node.

9. The power source system according to claim 3, wherein the conversion circuit includes a first diode, a second diode, a third diode and a fourth diode each having an anode and a cathode, wherein the anode of the first diode and the cathode of the second diode are connected to the second terminal of the semiconductor switch, and the anode of the third diode and the cathode of the fourth diode are connected to the first terminal of the semiconductor switch, and wherein the cathode of the first diode and the cathode of the third diode are connected to a first connection node interposed between the first diode and the third diode, and the anode of the second diode and the anode of the fourth diode are connected to a second connection node interposed between the second diode and the fourth diode, and a first conductive line connects the booster circuit to the first connection node and a second conductive line connects the booster circuit to the second connection node.

\* \* \* \* \*